(12) United States Patent  (10) Patent No.: US 8,071,269 B2
Long et al.  (45) Date of Patent: Dec. 6, 2011

(54) COMPRESSIBLE FLEXOGRAPHIC PRINTING PLATE CONSTRUCTION

(76) Inventors: Donald Long, Douglasville, GA (US); Ryan Vest, Cumming, GA (US)

( * ) Notice: Subject to any disclaimer, the term of this patent is extended or adjusted under 35 U.S.C. 154(b) by 492 days.

(21) Appl. No.: 11/986,074

(22) Filed: Nov. 20, 2007

(65) Prior Publication Data

US 2008/0107908 A1 May 8, 2008

Related U.S. Application Data

(62) Division of application No. 10/965,315, filed on Oct. 14, 2004, now Pat. No. 7,318,994.

(51) Int. Cl.
G03C 1/72 (2006.01)
G03C 1/00 (2006.01)
(52) U.S. Cl. ...................... 430/270.1; 430/138
(58) Field of Classification Search .............. 430/270.1, 430/302
See application file for complete search history.

(56) References Cited

U.S. PATENT DOCUMENTS

| | | | |
|---|---|---|---|
| 3,661,575 A | 5/1972 | Ketley et al. | |
| 3,990,897 A | 11/1976 | Zuerger et al. | |
| 4,266,007 A | 5/1981 | Hughes et al. | |
| 4,332,873 A | 6/1982 | Hughes et al. | |
| 4,582,777 A | 4/1986 | Fischer et al. | |
| 4,684,600 A | 8/1987 | Worns et al. | |
| 5,325,776 A | 7/1994 | Rather, Sr. et al. | |
| 5,352,507 A | 10/1994 | Bresson et al. | |
| 5,362,605 A * | 11/1994 | Mirle et al. | 430/284.1 |
| 5,364,683 A | 11/1994 | Flint et al. | |
| 5,370,968 A | 12/1994 | Goss et al. | |
| 5,476,712 A | 12/1995 | Hartman et al. | |
| 5,554,712 A | 9/1996 | Huynh-Tran et al. | |
| 5,750,315 A * | 5/1998 | Rach | 430/306 |
| 5,894,799 A | 4/1999 | Bart et al. | |
| 5,962,111 A * | 10/1999 | Rach | 428/195.1 |
| 5,976,765 A | 11/1999 | Kumpfmiller et al. | |
| 6,287,638 B1 | 9/2001 | Castelli et al. | |
| 6,688,226 B2 | 2/2004 | Rossini et al. | |
| 6,703,095 B2 | 3/2004 | Busshoff et al. | |
| 6,806,018 B2 * | 10/2004 | Kanga et al. | 430/138 |
| 2003/0054153 A1 | 3/2003 | Kuczynski et al. | |
| 2004/0241583 A1 * | 12/2004 | Kanga | 430/300 |
| 2006/0063109 A1 * | 3/2006 | Choi et al. | 430/300 |
| 2007/0042231 A1 * | 2/2007 | Kuczynski et al. | 428/909 |

* cited by examiner

*Primary Examiner* — Cynthia Kelly
*Assistant Examiner* — Chanceity Robinson
(74) *Attorney, Agent, or Firm* — Carmody & Torrance LLP

(57) ABSTRACT

The present invention relates to an improved compressible flexographic printing plate that uses a compressible layer comprising a polyurethane (meth)acrylate resin and microspheres. The process of the invention produces a chemically fused printing plate that eliminates the need for an adhesive to secure the compressible layer to the back of the printing plate.

7 Claims, 1 Drawing Sheet

COMPRESSIBLE FLEXOGRAPHIC PRINTING PLATE CONSTRUCTION

CROSS REFERENCE TO RELATED APPLICATIONS

This application is a divisional of application Ser. No. 10/965,315, filed on Oct. 14, 2004, now U.S. Pat. No. 7,318,994, the subject matter of which is herein incorporated by reference in its entirety.

FIELD OF THE INVENTION

The invention is directed to a method of making a compressible flexographic printing plate having an improved compressible foam layer.

BACKGROUND OF THE INVENTION

Flexographic printing is widely used in the production of newspapers and in the decorative printing of packaging media. Numerous photosensitive printing plate formulations have been developed to meet the demand for fast, inexpensive processing and long press runs.

Photosensitive printing elements generally comprise a support layer, one or more photosensitive layers, an optional slip film release layer, and an optional protective cover sheet. The protective cover sheet is formed from plastic or any other removable material that can protect the plate or photocurable element from damage until it is ready for use. The slip film may be disposed between the protective cover sheet and the photocurable layer(s) to protect the plate from contamination, increase ease of handling, and act as an ink-accepting layer.

Flexographic printing plates desirably work under a wide range of conditions. For example, they should be able to impart their relief image to a wide range of substrates, including cardboard, coated paper, newspaper, calendared paper, and polymeric films such as polypropylene and the like. Importantly, the image should be transferred quickly and with fidelity, for as many prints as the printer desires to make.

To prepare a printing plate with typical commercially available equipment, an image-bearing transparency or negative, i.e., a transparent film having opaque regions corresponding to the reverse of the image which one desires to impart to a printing plate, is placed on a glass platen, and covered with a transparent, polymeric cover film. The transparency and cover film are secured by vacuum to the platen, and a layer of photopolymerizable resin laminated to a backing sheet is placed on the cover film. Actinic radiation is shined through the glass platen toward the backing sheet. The regions of the resin which are impinged by the actinic radiation undergo polymerization or "curing" to form a cured resin that is insoluble in a solvent used for washing away uncured regions of the photopolymer to "develop" or reveal the relief image in the cured resin.

The regions of the resin layer which were protected from the actinic radiation by the opaque regions of the transparency are washed away using a developer solution. The cured regions are insoluble in the developer solution, and so after development a relief image formed of cured photopolymerizable resin is obtained. The cured resin is likewise insoluble in certain inks, and thus may be used in flexographic printing. The liquid photopolymerizable resin may also be exposed to actinic radiation from both sides of the resin layer.

Compressible materials have found great utility in flexographic printing, particularly in the printing of corrugated stock or similar substrates that have an uneven, deformable surface. With such substrates, the printing plate must be flexible so that it will conform to the uneven surface and evenly deliver a coating of ink thereon. However, if the plate is too soft or flexible, the image on the plate will distort under the pressure used to contact the plate with the substrate, and thus will not transfer the image with the desired fidelity.

Compressible printing plates are also useful in:
  A. printing on wide webs (films of cellophane, polyethylene, polypropylene, polyester, vinyl and paper having a web thickness in the range of about 0.5 to 5 mils to overcome sag and distortion and machine gauge variation by the compressibility of foam.
  B. printing safety papers (checks, bond and stock forms) with even uniform constant tone in background print.
  C. process printing (4 color printing) where uniformity of ink laydown is critical to proper color development.

Compressible printing plates also have a longer life. The mechanical shock to the plate, in each print motion, causes a gradual wearing of the relief, gradually leading to loss of sharpness in print. The compressible layer absorbs the mechanical shock leaving the relief printing surface relatively unaffected (minimal flattening or distortion) resulting in longer plate life.

Mounting a printing plate onto a compressible layer allows for that layer to deform and compress with the substrate, while the printing plate can then be made to withstand the rigors of direct contact with the substrate. The alternate approach involves making the printing plate softer, which can lead to an undesirable growth of the characters under the required printing impression pressure, particularly when printing on rough or uneven stock or on presses with uneven impression and/or plate cylinders.

On their own, high durometer plates can often damage the deformable substrate during the printing process. However, a higher durometer plate, in combination with a base compressible layer, can potentially solve both of these issues. In this way, one can use a fairly hard, i.e. high durometer, plate which will not provide a distorted image, and take advantage of the compressibility of the foam backing to allow the plate to bend and flex, and thereby contact all regions of an uneven substrate. Typical compressible layers consist of foamed materials, oftentimes polyurethane or other thermoplastic materials, and are often laminated to the back of a cured image-bearing printing plate using tape or other pressure sensitive adhesives.

A persistent problem with this approach however is that it is very difficult to secure the foam materials to the back of the plate. It is difficult to apply the adhesive uniformly, and foam materials exhibit the problem that they stretch during mounting to the plate and, if stabilized, cause buckling when the plate is flexed. In addition, these steps are time consuming, and therefore can be quite costly to the trade shops, mounters, and printers who are getting the plate ready for press. The extra backing layer can also actually interfere with the true compressibility of the plate construction.

In most cases, the printing plate is already completely exposed and developed before the compressible layer is secured thereto, although several examples exist wherein liquid or uncured solid photopolymeric materials are cast and directly exposed on top of the compressible layer. However, in all of these processes, the compressible layer is still formed in a separate step and then pretreated with an adhesive or some sort of tie coat layer to laminate the compressible layer to the printing plate.

U.S. Pat. No. 5,325,776, to Rather, Sr. et al., describes the use of polyurethane foam materials as compressible layers to be used in concert with a flexographic printing plate. However, the polyurethane foam is not UV-curable and requires a coating of an adhesive layer on top of the foam to secure the foam to the printing plate.

U.S. Pat. No. 5,894,799 to Bart et al., describes the use of an elastomeric photopolymer as the compressible layer, wherein the elastomeric photopolymer contains open cells on the surface to create the compressible nature. Photopolymerization is used only to create the open cells, and an adhesive layer is still required in the plate-laminating step. The compressible layer must then be pre-exposed, developed, and post-cured prior to being adhered to the printing plate. In addition, the elastomeric photopolymer of the compressible layer is a styrenic block copolymer-based photopolymer, not a polyurethane, and thus requires solvent development.

U.S. Pat. No. 5,962,111 to Rach, describes the casting of a liquid photopolymer layer onto a compressible material with open cells, and then insufficiently curing that layer to allow it to serve as a tie coat for the printing plate layer. A second coating of liquid resin is then coated on top of the pre-cured layer, and the plate is exposed and developed. In this instance, the compressible layer is required to have open cells, and is pre-treated with the resin of choice for making the printing plate. In essence, the photopolymer is serving as its own adhesive. Again, this system requires multiple steps until the final system is in place.

As is readily seen, while various methods have been suggested in the prior art for preparing compressible flexographic printing plates, there remains a need in the art for a simple manufacturing process for preparing compressible photopolymer plates that overcomes the shortcomings of plates made according to prior art methodologies.

The purpose of the present invention is to provide a one-step system for the production of compressible printing plates using conventional plate making methods and materials. Utilizing a photocurable resin, such as a polyurethane (meth)acrylate resin that contains thermoplastic microspheres, a compressible foam can be created and cast along with the first photocurable layer in which the relief image is formed and two layers cured simultaneously to form the compressible plate system of the invention. The one-step process of the invention eliminates the need for adhesives to lamination the compressible layer to the back of the exposed printing plate.

Furthermore, while most urethane foams are actually created during the polymerization step or by post-curing/blowing of the urethane, the present invention does not require any alteration of the urethane, only a blend of the final resin with the microspheres.

U.S. Pat. No. 6,287,638 to Castelli et al., describes the use of thermoplastic microspheres in the formation of printing blankets. The microspheres are dispersed into a thermoplastic medium and then vulcanized using heat to form a crosslinked matrix. The surface of the blanket is then cast on top of the surface of a carcass material. However, this is a non-ultraviolet curing system and is also a multi-step system, require a separate compressible layer-formation step before the printing element is ready to be used. Adhesion in these systems often requires the use of a tie coat layer to affix the printing layer on top of the compressible layer. Often times, the microsphere layer is covered with layers of fabric, so that the printing layer does not come into contact with the compressible layer per se, but rather comes into direct contact only with the fabric.

SUMMARY OF THE INVENTION

It is an object of the present invention to minimize the time it takes to ready a compressible flexographic printing plate for press usage.

It is another object of the present invention to eliminate the need for an adhesive layer between the printing plate and the compressible layer in the compressible printing plate system.

To that end, the present invention is directed to an improved compressible relief image printing plate comprising:
 a) a cover film;
 b) a photocurable layer directly on the cover film; and
 c) a photocurable compressible layer directly on the photocurable layer, the photocurable compressible layer comprising a polyurethane (meth)acrylate resin with thermoplastic microspheres uniformly dispersed therein;
wherein the photocurable layer and the compressible layer are simultaneously cured to create a chemically fused system.

The invention is also directed to a method of preparing a compressible relief image printing plate comprising the steps of:
 a) securing a photographic negative to a glass platen, wherein the photographic negative has opaque areas corresponding to a reverse of a desired relief image;
 b) covering the photographic negative with a transparent cover sheet;
 c) creating a bi-layer photocurable system on the cover sheet by casting a photocurable layer on the cover sheet and then casting a photocurable compressible layer directly on top of the photocurable layer;
 d) exposing the bi-layer photocurable system to actinic radiation through the photocurable compressible layer to cure the photocurable compressible layer and a portion of the photocurable layer to create a cured floor in the photocurable layer;
 e) exposing the bi-layer photocurable system to actinic radiation through the photographic negative to form the relief image in the photocurable layer; and
 f) washing away uncured portions of the photocurable layer to reveal the relief image in the compressible printing plate.

In an alternate embodiment, the invention is directed to a method of preparing a compressible relief image printing plate comprising the steps of:
 a) securing a photographic negative to a glass platen, wherein the photographic negative has opaque areas corresponding to a reverse of a desired relief image;
 b) covering the photographic negative with a transparent cover sheet;
 c) casting a photocurable layer onto the cover sheet;
 d) laminating a compressible foam layer to the liquid photocurable layer;
 e) exposing the photocurable layer to actinic radiation through the compressible layer to cure a portion of the photocurable layer to create a cured floor in the photocurable layer;
 f) exposing the photocurable layer to actinic radiation through the photographic negative to form the relief image in the photocurable layer; and
 g) washing away uncured portions of the photocurable layer to reveal the relief image in the compressible printing plate.

In this embodiment, the compressible foam layer is formed by:
 a) casting a layer of a photocurable composition comprising a polyurethane resin and thermoplastic microspheres to a desired thickness on a glass platen; and
 b) exposing the layer of photocurable composition to actinic radiation from both sides of the layer of photocurable composition to thoroughly cure the layer.

The polyurethane resin is preferably an acrylate or methacrylate polyurethane resin.

BRIEF DESCRIPTION OF THE DRAWINGS

For a fuller understanding of the invention, reference is had to the following description taken in connection with the accompanying figures, in which.

Also, while not all elements may be labeled in each figure, all elements with the same reference number indicate similar or identical parts.

DETAILED DESCRIPTION OF THE PREFERRED EMBODIMENTS

The present invention is directed to an improved compressible flexographic printing plate that minimizes the time it takes to ready the plate for press usage. The novel process of the invention uses a compressible layer that comprises a liquid polyurethane resin (preferably acrylate or methacrylate polyurethane resin) with thermoplastic microspheres dispersed therein. The microspheres serve to create voids in the urethane material, allowing for compressibility within the layer.

According to the process of the invention, a printing plate comprising a photopolymer layer and a compressible layer can be prepared having no adhesive or tie layer therebetween. Plates prepared according to the inventive process thus avoid the problems associated with using an adhesive, a tape or a tie layer to adhere the photopolymer layer to the compressible layer.

Figure 1:
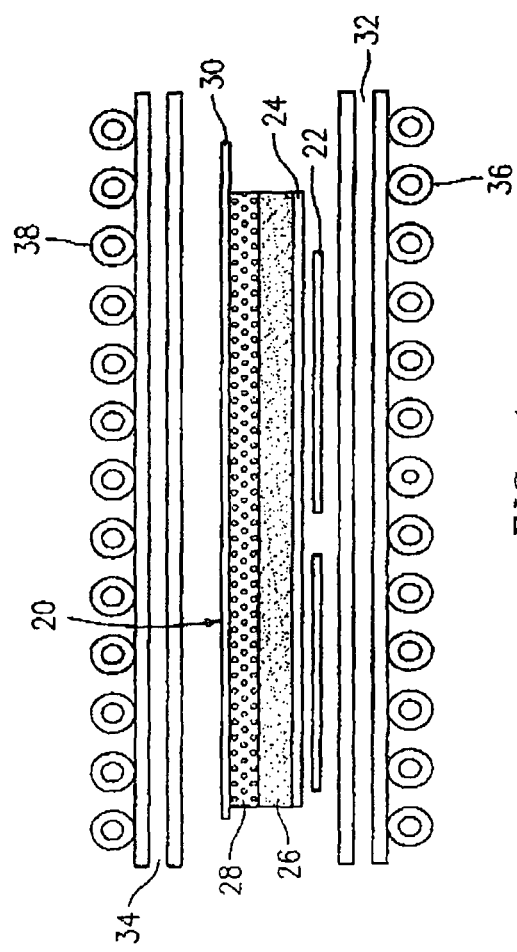
FIG. 1 is an illustration of a printing plate manufacturing process according to the present invention.
Figure 2:
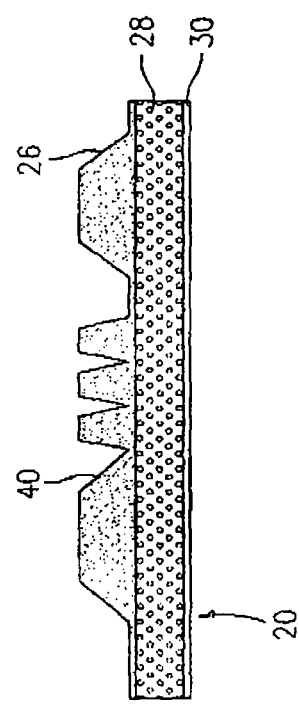
FIG. 2 is a partial cross-sectional schematic view of a printing plate produced by the process of the present invention.

The ideal formulation of the printing plate/compressible layer system is accomplished using conventional liquid photopolymer platemaking equipment, and is analogous to making a capped printing plate. FIG. 1 illustrates a portion of the flexographic printing plate manufacturing process for creating the compressible printing plates of the invention. FIG. 2 illustrates a printing plate 20 prepared by the novel process of the invention.

The method of manufacturing compressible flexographic printing plates 20 according to the present invention typically comprises the steps of:
a) securing a photographic negative 22 to a glass platen 32, wherein the photographic negative 22 has opaque areas corresponding to a reverse of a desired relief image;
b) covering the photographic negative 22 with a transparent cover sheet 24 to protect the photographic negative 22 (or other image-bearing transparency);
c) creating a bi-layer photocurable system on the cover sheet 24 by casting a first photocurable layer 26 on the cover sheet 24 and then casting a photocurable compressible layer 28 directly on top of the first photocurable layer 26;
d) exposing the bi-layer photocurable system to a source of actinic radiation 38 through the photocurable compressible layer 28 to cure the photocurable compressible layer 28 and a portion of the first photocurable layer 26 to create a cured floor in the first photocurable layer 26;
e) exposing the bi-layer photocurable system to another source of actinic radiation 36 through the photographic negative 22 to form the relief image 40 (shown in FIG. 2) in the first photocurable layer 26; and
f) washing away uncured portions of the first photocurable layer 26 to reveal the relief image 40 in the compressible printing plate 20.

The first photocurable layer 26 is cast onto the cover sheet 24 by releasing a liquid photocurable composition from a resin reservoir, and casting the composition onto the transparent cover film 24 with the aid of a leveling blade.

Optionally, the plate system can be a traditional capped system, which requires the casting of a very thin layer of photopolymer resin before the first photocurable layer 26 is cast, followed by the compressible layer 28.

The total thickness of the first photocurable layer 26 and the compressible layer 28 are determined by the amount of resin cast, the settings of the doctor blade used to laminate the resin across the glass, and the shims used to hold a fixed distance between the upper and lower glass. The compressible printing plate 20 of the invention may further comprise a platebacking material (support layer) 30, which is generally a polyester film coated with an adhesion promoting layer, and is used to lock in the dimensional stability of the material. The platebacking material 30 can be the same material that is used to make conventional flexographic printing plates.

A glass platen 32 is positioned between the photographic negative 22 and a first source of actinic radiation 36. A second source of actinic radiation 38 is positioned above the platebacking material 30. In a preferred embodiment, the first source of actinic radiation 36 and the second source of actinic radiation 38 comprises a bank of fluorescent tubes. A glass platen 34 is positioned between the platebacking material 30 and the second source of actinic radiation 38 to provide a means for controlling thickness uniformity of the first photocurable layer 26, by lowering the glass platen 34 prior to exposure to rest on shims and make contact with the platebacking material 30.

Upon exposure to actinic radiation, the photocurable resin polymerizes and changes from a liquid to a solid state, to form both a floor and a raised relief image 40 in the first photocurable layer 26.

The compressible layer 28 of the invention generally comprises a liquid polyurethane resin having microspheres uniformly dispersed therein. The compressible layer 28 may also contain a photoinitiator. The polyurethane resin is preferably an acrylate or methacrylate polyurethane resin.

The choice of the microspheres is important to the success of this invention. The microspheres are preferably of uniform size and/or uniform particle distribution and can exist as either expanded or unexpanded particles. In a preferred embodiment, expanded microspheres are used, due to the heat required to effectively mix the microspheres into the viscous polyurethane methacrylate resin composition. The weight percent of the microspheres in the compressible composition typically ranges from about 0.5% to about 5.0% by weight of the resin formulation, but is not preferably from about 1.0% to 2.5% by weight.

Regardless of whether the microsphere is expanded or unexpanded, the microspheres generally consist of a thermoplastic shell encapsulating a hydrocarbon. The shell of the microsphere is typically a copolymer of acrylonitrile and vinylidene chloride or methacrylonitrile, and the hydrocarbon inside the shell is typically isobutane or isopentane. There are a number of commercial sources for thermoplastic microspheres. EXPANCEL® is a trade name for microspheres available from Noble Industries. Dualite and Micropearl polymeric microspheres are available from Pierce & Stevens Corporation.

Preferably, both the first photocurable layer 26 and the compressible layer 28 comprise polyurethane di(meth)acrylate resins.

Liquid polyurethane methacrylate resins are common feedstocks for liquid photopolymer platemaking. Due to the similarities between the foam and the base resin chemistries, both being polyurethane di(meth)acrylates and containing similar monomers, adhesion is enhanced. The physical properties of the compressible foam layer 28 can be altered through the appropriate choice of polyurethane prepolymer, together with the appropriate choice and proportion of the acrylate/methacrylate monomers. Using photoinitiators suitable for thick film imaging or high optical density imaging, i.e., a pigmented/heavily dyed system, the foam can be thoroughly cured under ultraviolet light to lock the microspheres into a crosslinked matrix, and also to lock in the desired physical properties of the foam.

The first photocurable layer 26 generally has a thickness of about 0.030 to about 0.250 inches, and is chosen for its compatibility with the compressible layer 28 such that after the curing process, the first photocurable layer 26 and the compressible layer 28 remain distinct entities yet bond together tightly enough (without the aid of an adhesive) such that the layers will not separate or fracture during the printing process. The novel process of the invention produces a chemically fused printing plate 20 is produced by the diffusion of the first photocurable layer 26 and the compressible layer 28 into each other when the layers are exposed to actinic radiation.

A further advantage to the process of the invention is that the thickness of the compressible layer 28 can be adjusted to meet the needs of the printing job by adjusting the platemaking parameters. In contrast, current compressible printing plate systems require the storage of multiple thicknesses of the compressible materials to meet various needs of different print jobs. The compressible layers 28 formed in the process of the instant invention generally have a thickness of about 0.015 in. to about 0.125 in., depending on the type of substrate to be printed. The overall printing plate thickness typically ranges from about 0.045 in to about 0.155 in.

Suitable liquid photocurable materials include unsaturated polymeric compounds such as polyesters, polyethers, polyene-thiol compositions, polyurethanes, terminally unsaturated homopolymers and copolymers of butadiene, isoprene, chloroprene, styrene, isobutylene, and ethylene in which the terminal unsaturation is attached to the polymer through a combination of at least two ether, thioether, ester, keto, or amide groups, used in combination with a photoinitiator. Exemplary liquid photocurable materials are disclosed in U.S. Pat. No. 3,661,575 to Ketley et al., U.S. Pat. No. 4,332,873 to Hughes et al., and U.S. Pat. No. 4,266,007 to Hughes et al., the subject matter of each of which is incorporated herein by reference in its entirety. Other liquid photocurable materials would also be known to one skilled in the art.

The liquid photopolymerizable (or photocurable) layer(s) can include any of the known photopolymers, monomers, initiators, reactive or non-reactive diluents, fillers, and dyes. The term "photocurable" refers to a solid composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator.

The hardness of the compressible layer 28 and the first photocurable layer 26 is achieved by adjusting the composition of each layer so that the layers will have the desired relative hardness after curing. This is typically accomplished by those skilled in the art by controlling the amount of cross-linking which occurs during photopolymerization. The amount of cross-linking in a polymer composition is directly proportional to its hardness. Those skilled in the art typically control the amount of cross-linking by choosing or making polymers with different degrees of unsaturation. The more unsaturation within a polymer composition, the more cross-linked the polymer will be once cured and, hence, the harder it will be. This and other methods of achieving different degrees of hardness and other desired physical and chemical characteristics of cured photopolymer resins comprising relief image flexographic printing plates are well known to those skilled in the art and are discussed in detail in U.S. Pat. No. 4,332,873 to Hughes et al. and U.S. Pat. No. 3,990,897 to Zuerger et al., the subject matter of each of which is herein incorporated by reference in its entirety. Hardness is typically measured according to the procedure set forth in ASTM standard D 2240-91 (Standard Test Method for Rubber Property-Durometer Hardness).

The photocurable layers of the invention should cross-link (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions for curing the photocurable materials of the invention are from about 250 nm to about 450 nm, more preferably from about 300 nm to about 400 nm, even more preferably from about 320 nm to about 380 nm. One suitable source of actinic radiation is a UV lamp, although other sources are generally known to those skilled in the art.

The compressible plate 20 of the invention is processed as a normal liquid photopolymer is traditionally processed—including the steps of reclaim, washout, post exposure, drying and light finishing to remove the unexposed photopolymer layer. The finished plate is then mounted on a cylinder of a printing press. The resulting plate material can then be processed. The end result is a pre-mounted printing plate/compressible layer system that is ready to go to press.

In an alternate approach, two separate casting and exposure stages are utilized. The foam layer is made separately from the complete system by simply casting the desired thickness of foam onto the glass and exposing the plate thoroughly; both a back exposure and a face exposure are desired for thorough through-cure. The foam "plate" can then be used as the backing layer in a subsequent platemaking step, by laminating the foam as is traditionally done for simple polyester backings, followed by back and face exposures. This aids to lock in adhesion and to help imaging by providing some relief layer with the base resin. Creating some relief will ease the ability of light scatter to occur from the foam layer through the base layer.

In this approach, the method generally comprises the steps of:
 a) securing a photographic negative to a glass platen, wherein the photographic negative has opaque areas corresponding to a reverse of a desired relief image;
 b) covering the photographic negative with a transparent cover sheet;
 c) casting a first photocurable layer onto the cover sheet;
 d) laminating a compressible foam layer to the liquid photocurable layer;
 e) exposing the first photocurable layer to actinic radiation through the compressible layer to cure a portion of the first photocurable layer to create a cured floor in the first photocurable layer;

f) exposing the first photocurable layer to actinic radiation through the photographic negative to form the relief image in the first photocurable layer; and g) washing away uncured portions of the first photocurable layer to reveal the relief image in the compressible printing plate.

In this alternate approach, the compressible foam layer is formed by:

a) casting a layer of a photocurable composition comprising a polyurethane (meth)acrylate resin and thermoplastic microspheres to a desired thickness on a glass platen; and b) exposing the layer of photocurable composition to actinic radiation from both sides of the layer of photocurable composition to thoroughly cure the layer.

This is an alternate approach from both the end-user's point of view and from the manufacturer.

As is readily apparent, the manufacturer has the choice of providing liquid foam (the first approach) or the cured foam substrate (the second approach) to the consumer. In the preferred embodiment, the liquid foam is provided, as the one step system is more time-efficient and more quality-efficient, yielding a better adhesion of the layers of the printing plate and better imaging of the printing plate.

One of the major advantages of the process of the present invention lies in its time and material savings steps. No separate foam material is needed, only the microsphere-containing resin. In addition, an adhesive layer is not required for laminating the printing plate onto the compressible layer. Furthermore, since the curing of the foam and base resin occurs simultaneously, a chemically fused system is created as a result of diffusion of one layer into the other. In this way, the process of the invention is analogous to the formation of capped printing plates, in which the thin layer cap is slightly crosslinked into the base resin, although retaining much of its own physical properties as a secondary layer.

A typical formulation for the compressible composition useful in the practice of this invention is:

62 parts polyurethane methacrylate oligomer
1 part photoinitiator (such as Ingacure 651 or 819 available from Ciba Geigy)
0.1 part butylated hydroxy toluene
7 parts 2-ethoxy ethoxy ethyl acrylate
5 parts diethylene glycol dimethacrylate
14 parts polypropylene glycol monomethacrylate
7 parts lauryl methacrylate
1 part Expancel 551 DE-80 Microspheres (avail from Noble Industries)

What is claimed is:

1. A compressible flexographic printing plate comprising, in order:

a) a cover film;

b) a liquid photocurable layer directly on the cover film; and c) a liquid photocurable compressible layer on the liquid photocurable layer, the liquid photocurable compressible layer comprising a polyurethane acrylate or polyurethane methacrylate resin with thermoplastic microspheres uniformly dispersed therein;

wherein the photocurable layer and the compressible layer are liquid at the time the photocurable layer and the compressible layer are simultaneously cured to create a chemically fused system.

2. The compressible flexographic printing plate according to claim 1, wherein the cover film comprises polyethylene terephthalate.

3. The compressible flexographic printing plate according to claim 1, wherein the liquid photocurable layer and the liquid compressible layer both comprise polyurethane di(meth)acrylate resins.

4. The compressible flexographic printing plate according to claim 1, wherein the microspheres are expanded microspheres.

5. The compressible flexographic printing plate according to claim 1, wherein the compressible layer comprises from about 1 percent to about 2.5 percent by weight of the microspheres.

6. The compressible flexographic printing plate according to claim 1, further comprising a dimensionally stable support layer disposed adjacent to the compressible layer.

7. The compressible flexographic printing plate according to claim 1, wherein the compressible layer has a thickness of between about 0.015 inches and about 0.125 inches.

* * * * *